United States Patent [19]

Raghunathan

[11] Patent Number: 4,469,960
[45] Date of Patent: Sep. 4, 1984

[54] VOLTAGE TRANSLATING CIRCUIT

[75] Inventor: Kuppuswamy Raghunathan, Austin, Tex.

[73] Assignee: Motorola, Inc., Schaumburg, Ill.

[21] Appl. No.: 395,958

[22] Filed: Jul. 7, 1982

[51] Int. Cl.³ .............................................. H03K 5/00
[52] U.S. Cl. ................................ 307/264; 307/296 R; 307/475
[58] Field of Search ............... 307/264, 296 R, 296 A, 307/475, 355, 360

[56] References Cited

U.S. PATENT DOCUMENTS 4,216,390  8/1980  Stewart ................................ 307/264
4,314,166  2/1982  Bismarck ............................. 307/264

Primary Examiner—John Zazworsky
Attorney, Agent, or Firm—Anthony J. Sarli, Jr.; Jeffrey Van Myers

[57] ABSTRACT

A voltage translating circuit is disclosed having a first field effect transistor of a first type coupled in series with a second field effect transistor of a second type between a first supply voltage node and an input node, with the respective current channel regions thereof coupled to the same node as the sources thereof, and the gates thereof coupled to another input node. A third field effect transistor of the second type is interposed between the first and second transistors with the current channel region thereof coupled to the same node as the source region of the second transistor and the gate thereof coupled to yet another input node. A fourth field effect transistor of the second type is connected in parallel with the second and third transistors between the output node, formed by the common drains of the first and third transistors, and the first of said input nodes, with the current channel region of the fourth transistor being coupled to the same node as the sources of the second and third transistors and the gate thereof coupled to a negative supply voltage node.

2 Claims, 1 Drawing Figure

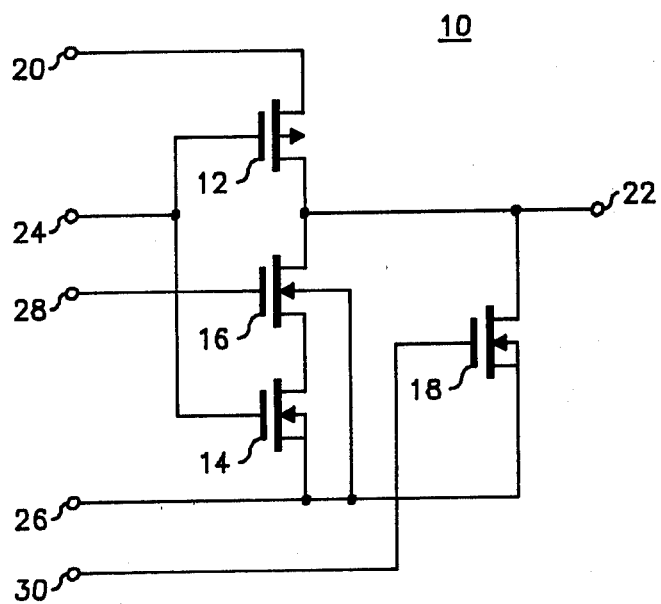

VOLTAGE TRANSLATING CIRCUIT

CROSS REFERENCE TO RELATED APPLICATIONS

Related subject matter can be found in copending U.S. Patent application Ser. No. 395,424 entitled "A Voltage Detecting Circuit", filed simultaneously herewith and assigned to the assignee of the present invention.

BACKGROUND OF THE INVENTION

1. Field of the Invention

This invention relates generally to voltage translating circuits, and more particularly, to a voltage translating circuit for translating an input signal which is within the range of the supply voltages of the circuit to an output signal which has a greater voltage range.

2. Description of the Prior Art

In general, voltage translating circuits are designed to provide an output signal which is related to, but different from, an input signal which is within the range of the supply voltages of the circuit. In some applications, it is desirable to provide an output voltage which is outside the range of the normal supply voltages of the translating circuit. For example, in a typical monolithic microprocessor having an electrically programmable read only memory (EPROM), the supply voltages of the microprocessor will be +5 volts and 0 volts. However, the on-chip EPROM can only be programmed using a programming voltage well outside of these supply voltages. In a typical N-channel device, the programming voltage will be of the order of +20 volts, while in a CMOS device the programming voltage would be of the order of −15 to +20 volts depending upon the conductivity type of the field effect transistors used to form the EPROM storage cells. If the microprocessor is also of the self-programming type, i.e. capable of automatically transfering the contents of an external memory into the on-chip EPROM, some means must be provided to couple the programming voltage to the EPROM programming logic when the device is forced into the self-programming mode. One convenient way for performing this function is to provide a voltage translating circuit which selectively provides as an output signal the programming voltage when the latter is applied to a particular input pin of the microprocessor. However, prior art voltage translating circuits of this type have tended to be relatively complicated. In addition, such circuits typically require bias voltage generating circuits for biasing the current channel regions of the coupling transistors.

SUMMARY OF THE INVENTION

An object of the present invention is to provide a simple voltage translating circuit for translating an input signal inside the range of the supply voltages of the circuit to an output signal outside such range.

Another object of the invention is to provide a voltage translating circuit for providing an output signal which is substantially the same voltage as a control voltage outside the range of the supply voltages of the circuit.

These and other objects are achieved in a voltage translating circuit comprising a first field effect transistor having a source region of a first conductivity type coupled to a first operating voltage node, a drain region of the first conductivity type coupled to an output node, a current channel region of a second conductivity type between the source and drain regions thereof and coupled to the first operating voltage node, and a gate electrode adjacent to but insulated from the current channel region thereof and coupled to a first input node; a second field effect transistor having a source region of the second conductivity type coupled to a second input node, a drain region of the second conductivity type, a current channel region of the first conductivity type between the source and drain regions thereof and coupled to the second input node, and a gate electrode adjacent to but insulated from the current channel region thereof and coupled to the first input node; a third field effect transistor having a source region of the second conductivity type coupled to the drain region of the second transistor, a drain region of the second conductivity type coupled to the output node, a current channel region of the first conductivity type between the source and drain regions thereof and coupled to the second input node, and a gate electrode adjacent to but insulated from the current channel region thereof and coupled to a third input node; and a fourth field effect transistor having a source region of the second conductivity type coupled to the second input node, a drain region of the second conductivity type coupled to the output node, a current channel region of the first conductivity type between the source and drain regions thereof and coupled to the second input node, and a gate electrode adjacent to but insulated from the current channel region thereof and coupled to a second operating voltage node.

BRIEF DESCRIPTION OF THE DRAWING

The single FIGURE is a schematic diagram of a voltage translating circuit constructed in accordance with the present invention.

DESCRIPTION OF THE PREFERRED EMBODIMENT

Shown in the FIGURE is a voltage translating circuit 10 comprised of a P-channel field effect transistor 12 and three N-channel field effect transistors 14, 16 and 18. The transistor 12 has a P-type source region coupled to a positive supply voltage node 20, a P-type drain region coupled to an output node 22, an N-type current channel region between the source and drain regions thereof and coupled to the positive supply voltage node 20, and a gate electrode adjacent to but insulated from the current channel region thereof and coupled to a first input node 24. The transistor 14 has an N-type source region coupled to a second input node 26, an N-type drain region, a P-type current channel region between the source and drain regions thereof and coupled to the second input node 26, and a gate electrode adjacent to but insulated from the current channel region thereof and coupled to the first input node 24. The transistor 16 has an N-type source region coupled to the drain region of the transistor 14, an N-type drain region coupled to the output node 22, a P-type current channel region between the source and drain regions thereof and coupled to the second input node 26, and a gate electrode adjacent to but insulated from the current channel region thereof and coupled to a third input node 28. The transistor 18 has an N-type source region coupled to the second input node 26, and N-type drain region coupled to the output node 22, a P-type current channel region between the source and drain regions thereof and coupled to the second input node 26, and a gate electrode adjacent to but insulated from the current channel region thereof and coupled to a negative supply voltage node 30.

In operation, the positive and negative supply voltage nodes 20 and 30, respectively, will be coupled to a power supply (not shown) capable of developing a potential differential of the order of +3 to +15 volts therebetween. In a first mode of operation, the second input node 26 will be coupled to the negative supply voltage, and the third input node will be coupled to the positive supply voltage. Thus, the transistor 16 will be biased in the on or conducting condition and the transistor 18 will be biased in the off or non-conducting condition. Under these conditions, transistors 12 and 14 form an inverter with respect to the first input node 24, with transistor 12 charging output node 22 to the positive supply voltage in response to the first input node 24 being coupled to the negative supply voltage and transistor 14 discharging output node 22 to the negative supply voltage in response to the first input node 24 being coupled to the positive supply voltage.

In a second mode of operation, the second and third input nodes 26 and 28, respectively, will be coupled to a control voltage which is below the negative supply voltage by at least the threshold voltage of the transistors 14 and 18. Thus, the transistor 16 will be biased in the off or non-conducting condition and the transistor 18 will be biased in the on or conducting condition. Under these conditions, transistors 12 and 18 form an inverter with respect to the first input node 24, with transistor 12 being suffiently strong to charge the output node 22 to the positive supply voltage in response to the first input node 24 being coupled to the negative supply voltage, and transistor 18 being allowed to discharge the output node 22 to the control voltage in response to the first input node 24 being coupled to the positive supply voltage to bias the transistor 12 in the off or non-conducting condition.

One use for the voltage translating circuit 10 described above is in an electrically programmable read only memory (EPROM) integrated circuit to selectively couple a characteristic programming voltage outside the range of the normal supply voltages from the second input node 26 to an associated array word line. An example of a voltage detecting circuit suitable for cooperating with voltage translating circuit 10 by selectively coupling either the positive supply voltage or the programming voltage to gate electrode of the transistor 16 depending upon whether or not the programming voltage is coupled to the second input node 26, is described in the copending application Ser. No. 395,424 cited above.

From the example give above, it can be seen that the voltage translating circuit 10 provides as the output thereof the positive or negative supply voltages selected via the signal applied to the first input node 24 when the signal applied to the second and third input nodes 26 and 28, respectively, are not below the negative supply voltage; and between the positive supply voltage and the voltage on the second and third input nodes 26 and 28, respectively, when the latter is below the negative supply voltage. However, the voltage translating circuit 10 can be easily modified to translate to voltage above the positive supply voltage. Other changes and modifications may be made to the preferred embodiment described herein without departing from the spirit and scope of the present invention as defined in the following claims.

I claim:

1. A voltage translating circuit comprising:
   a first field effect transistor having a source region of a first conductivity type coupled to a first operating voltage node, a drain region of the first conductivity type coupled to an output node, a current channel region of a second conductivity type between the source and drain regions thereof and coupled to the first operating voltage node, and a gate electrode adjacent to but insulated from the current channel region thereof and coupled to a first input node;
   a second field effect transistor having a source region of the second conductivity type coupled to a second input node, a drain region of the second conductivity type, a current channel region of the first conductivity type between the source and drain regions thereof and coupled to the second input node, and a gate electrode adjacent to but insulated from the current channel region thereof and coupled to the first input node;
   a third field effect transistor having a source region of the second conductivity type coupled to the drain region of the second transistor, a drain region of the second conductivity type coupled to the output node, a current channel region of the first conductivity type between the source and drain regions thereof and coupled to the second input node, and a gate electrode adjacent to but insulated from the current channel region thereof and coupled to a third input node; and
   a fourth field effect transistor having a source region of the second conductivity type coupled to the second input node, a drain region of the second conductivity type coupled to the output node, a current channel region of the first conductivity type between the source and drain regions thereof and coupled to the second input node, and a gate electrode adjacent to but insulated from the current channel region thereof and coupled to a second operating voltage node.

2. The circuit of claim 1 wherein the first transistor has a P-type source and drain regions and an N-type current channel region, and wherein the second, third and fourth transistors each have N-type source and drain regions and P-type current channel regions.

* * * * *